United States Patent
Shibata

(10) Patent No.: US 7,184,726 B2
(45) Date of Patent: Feb. 27, 2007

(54) BROADCAST RECEIVER

(75) Inventor: Koji Shibata, Kawagoe (JP)

(73) Assignee: Pioneer Corporation, Tokyo (JP)

( * ) Notice: Subject to any disclaimer, the term of this patent is extended or adjusted under 35 U.S.C. 154(b) by 602 days.

(21) Appl. No.: 09/822,835

(22) Filed: Apr. 2, 2001

(65) Prior Publication Data
US 2003/0045254 A1 Mar. 6, 2003

(30) Foreign Application Priority Data
Mar. 31, 2000 (JP) .............................. 2000-097424

(51) Int. Cl.
*H04B 1/18* (2006.01)
*H04H 1/00* (2006.01)

(52) U.S. Cl. ............... 455/179.1; 455/3.02; 455/150.1; 725/131

(58) Field of Classification Search ............. 455/179.1, 455/182.1, 183.2, 188.1, 192.1, 192.2, 561, 455/136, 150.1, 3.02, 3.04; 348/555; 725/37, 725/131, 151
See application file for complete search history.

(56) References Cited

U.S. PATENT DOCUMENTS

| | | | | |
|---|---|---|---|---|
| 5,073,931 A | * | 12/1991 | Audebert et al. ........... 380/251 |
| 5,465,396 A | * | 11/1995 | Hunsinger et al. ............. 455/61 |
| 5,734,444 A | * | 3/1998 | Yoshinobu ................... 725/14 |
| 5,757,854 A | * | 5/1998 | Hunsinger et al. .......... 375/260 |
| 5,850,415 A | * | 12/1998 | Hunsinger et al. .......... 374/216 |
| 5,862,104 A | * | 1/1999 | Matsumoto ..................... 369/7 |
| 6,154,452 A | * | 11/2000 | Marko et al. ................ 370/321 |
| 6,259,482 B1 | * | 7/2001 | Easley et al. ................ 348/485 |
| 6,351,290 B1 | * | 2/2002 | Limberg ..................... 348/555 |
| 6,452,644 B1 | * | 9/2002 | Shimakawa et al. ........ 348/730 |
| 6,775,654 B1 | * | 8/2004 | Yokoyama et al. ......... 704/500 |

FOREIGN PATENT DOCUMENTS

JP 09-055642 2/1997
WO WO 99/14874 A 3/1999

OTHER PUBLICATIONS

M. Uehara et al. "Transmission Scheme For The Terrestrial ISDB System" IEEE Transactions on Consumer Electronics, IEEE Inc New York, vol. 45, No. 1, Feb. 1999, pp. 101-106.
Japanese Patent Office Action Application No. 2000-097424.

* cited by examiner

*Primary Examiner*—Tony T. Nguyen
(74) *Attorney, Agent, or Firm*—Sughrue Mion, PLLC

(57) ABSTRACT

A broadcast receiver which detects the reception status of radio waves from other stations without deteriorating the reception status of a currently-receiving station, in digital broadcasting where consecutive time series data is transmitted. The amount of time-based interleave applied to the currently-receiving data is determined so that the reception status of the radio waves from other stations is detected while the reception of the currently-receiving broadcast station is interrupted within the extent where missing data can be recovered by such interleave and error correction processing on demodulation.

19 Claims, 6 Drawing Sheets

FIG.4

RELATION BETWEEN TMCC SIGNAL AND AMOUNT OF INTERLEAVE

| $b_{35}$ | $b_{36}$ | $b_{37}$ | INTERLEAVE LEVEL | AMOUNT OF INTERLEAVE |
|---|---|---|---|---|
| 0 | 0 | 0 | 0 | NO |
| 0 | 0 | 1 | 1 | SMALL |
| 0 | 1 | 0 | 2 | ↓ |
| 0 | 1 | 1 | 3 | ↓ |
| 1 | 0 | 0 | 4 | LARGE |

NOTE : $b_{35}$, $b_{36}$, AND $b_{37}$ REPRESENT 35-TH TO 37-TH BITS OF THE TMCC SIGNAL, RESPECTIVELY

BROADCAST RECEIVER

BACKGROUND OF THE INVENTION

1. Field of the Invention

The present invention relates to a receiver for broadcast radio waves.

2. Description of the Related Background Art

In conventional broadcast receivers, it is widely adopted to detect the reception status of radio waves from other stations while receiving a radio wave from one station. Such an operation makes it possible to provide only the stations of favorable reception status for user's selection when the user switches from a currently-receiving station to another. This means an improved operability of the receivers upon station selections. The operation also makes feasible the technique of so-called frequency diversity, in which the reception system is switched to the radio wave from another station that broadcasts the same program when the currently-receiving radio wave deteriorates in reception status.

Nevertheless, when the operation described above is implemented in a so-called one-tuner receiver which performs such reception processing as high frequency amplification, tuning, and detection in a single set alone, various contrivances are required for precluding interruptions of the currently-receiving broadcast. For example, in the cases of television broadcast radio waves, periods of no picture signal transmission, or vertical blanking intervals, have been conventionally used to detect the radio waves from other stations.

However, in the case of the digital broadcast in which the video signal and the like signals are converted to digital data that is continuous in terms of time series, information associated with the vertical blanking period also is converted to digital data. Therefore, if it is attempted to adopt a process for detecting other-station radio waves that utilizes the vertical blanking intervals like the detection process for the analog television broadcast, that would result in undesirable droping of data.

SUMMARY OF THE INVENTION

It is thus an object of the present invention to resolve such a problem and provide a broadcast receiver which can detect the reception status of the radio waves from other stations without interrupting the currently-receiving picture signals and sound signals even in digital broadcasts.

A broadcast receiver according to the present invention comprises: a station selecting part for selecting a broadcast station specified by a station selection command; a detection and demodulation part for receiving a radio wave from the broadcast station, and detecting and demodulating the same to generate a received signal; a signal analyzing part for analyzing the received signal and determining the signal processing mode; station selection control part for generating the station selection command using the result from the signal analyzing part; and reception status detecting part for interrupting, while receiving one broadcast station, the reception of the broadcast station and receiving other broadcast stations based on the station selection command, thereby detecting the reception status of radio waves from the other stations.

BRIEF DESCRIPTION OF THE DRAWINGS

FIG. 4 is a table showing the relation between a TMCC signal and the amount of interleave.

DETAILED DESCRIPTION OF THE PREFERRED EMBODIMENT

Figure 1:
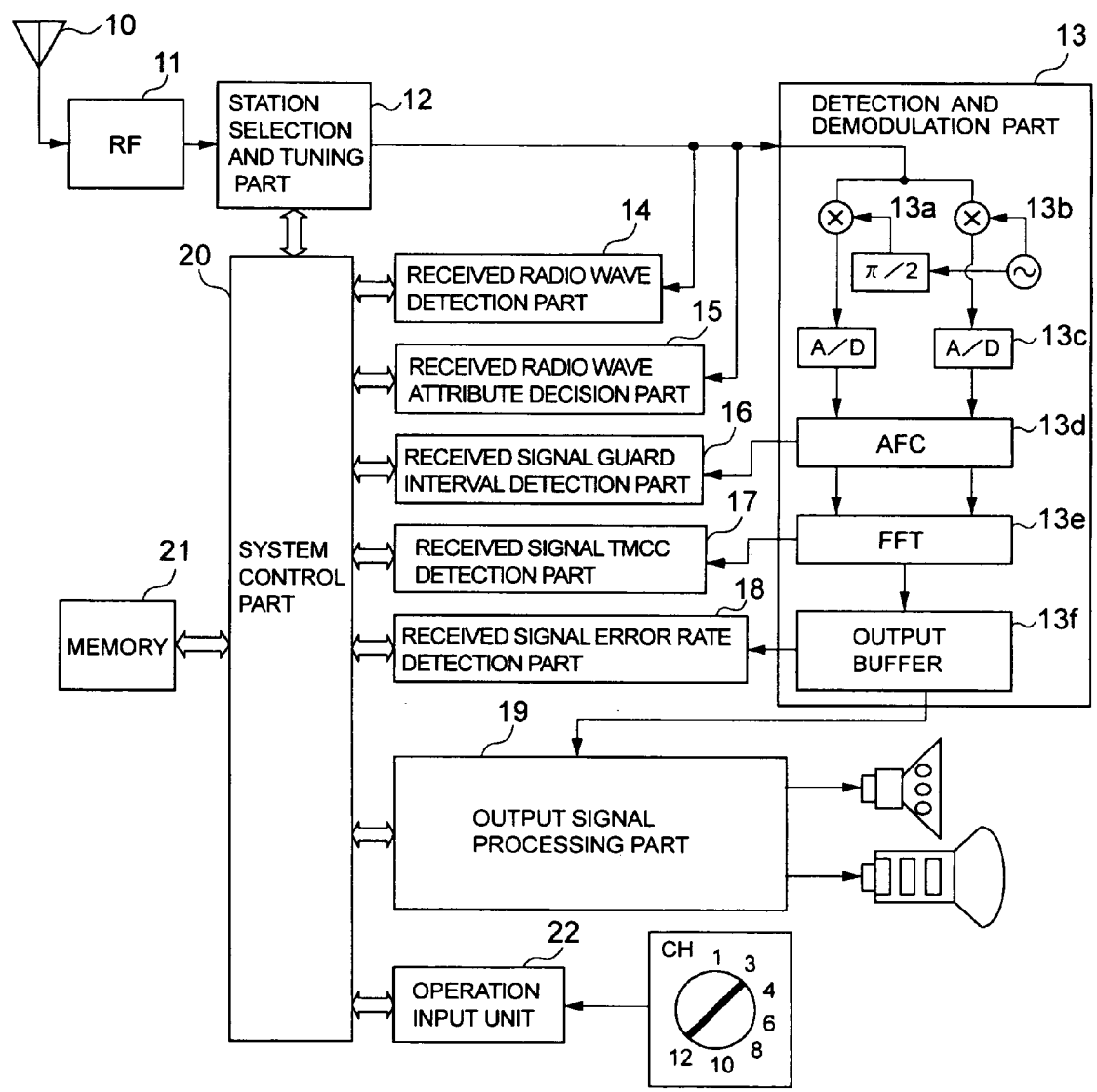
FIG. 1 is a block diagram showing the configuration of an ISDB-T broadcast receiver which is an embodiment of the present invention.

FIG. 1 is a block diagram showing the configuration of an ISDB-T (Terrestrial Integrated Services Digital Broadcasting) receiver according to the present invention.

In FIG. 1, a receiving antenna 10 is a small-size antenna such as a rod antenna and a planar antenna. The receiving antenna 10 receives radio waves from broadcast stations.

An RF part 11 governs the front end functions of the receiver, including high frequency amplification and frequency conversion on the radio waves received by the receiving antenna 10.

A station selection and tuning part 12 has the function of tuning and selecting, under a station selection command signal from a system control part 20, the radio wave from a specific broadcast station out of the received radio waves based on a predetermined station selection pattern and timing.

A detection and demodulation part 13 consists chiefly of an OFDM demodulation circuit to be described later. The detection and demodulation part 13 detects and demodulates received radio waves supplied from the station selection and tuning part 12 to generate received data, which is supplied to an output signal processing part and other processing circuits.

A received radio wave detection part 14 applies AM detection to the output of the station selection and tuning part 12, thereby detecting whether or not a carrier exists on a desired frequency. The result is supplied to the system control part 20.

A received radio wave attribute decision part 15 distinguishes whether the received radio waves mentioned above are ISDB-T broadcast radio waves or analog broadcast radio waves. The result is supplied to the system control part 20.

A received signal error rate detection part 18 checks the demodulation data error rate of a received ISDB-T broadcast signal. The result is supplied to the system control part 20.

A TMCC signal detection part 17 detects a transmission and multiplexing configuration control (TMCC) signal, a kind of control signal included in ISDB-T broadcast data, and supplies the same to the system control part 20.

A guard interval detection part 16 detects guard intervals included in the received ISDB-T broadcast signal, and supplies the same to the system control part 20.

An output signal processing part 19 reproduces the picture signals and sound signals transmitted from broadcast stations, based on the demodulation data supplied from the detection and demodulation part 13. The reproduced signals are output to display equipment such as a CRT and a liquid crystal panel, and/or audio equipment such as loudspeakers and headphones.

An operation input part 22 comprises a keyboard or a group of switches from which a variety of operation commands such as a station selection command are input to this receiver.

The system control part 20, consisting chiefly of a microcomputer, controls the operations of the entire receiver. For example, the system control part 20 executes a main routine stored in a memory part 21 step by step in synchronization with an internal clock.

The memory part 21 is composed of memory elements including a read only memory (ROM) and a random access memory (RAM). The ROM stores programs pertaining to the main routine for controlling the operations of this receiver as well as various subroutines. Besides, the RAM temporarily stores the results of the processing by the main routine and various subroutines.

Hereinafter, description will be given of the operation and processing of the receiver shown in FIG. 1, in its other-station radio wave detecting mode.

Figure 2:
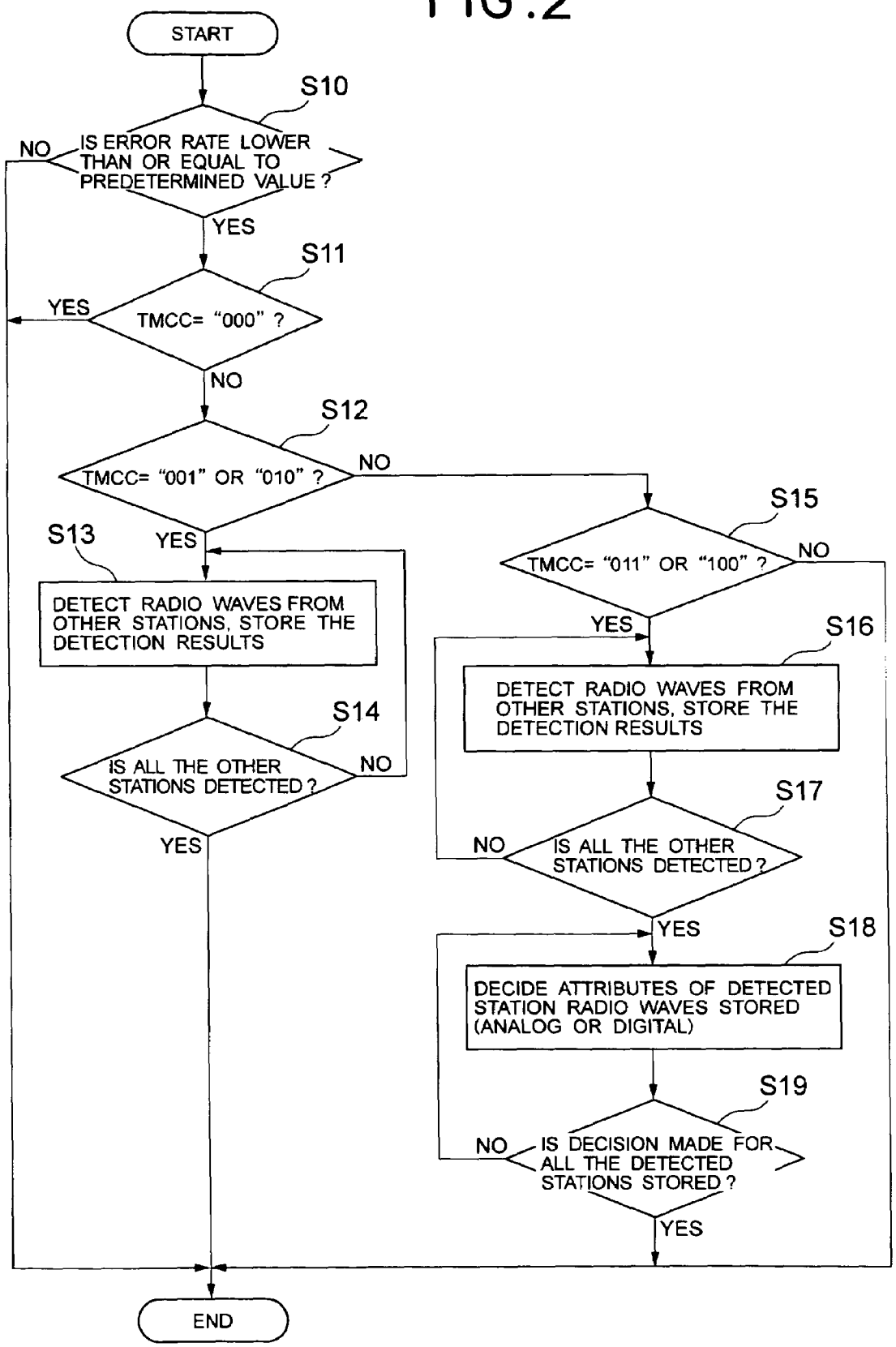
FIG. 2 is a flowchart showing the operation of the receiver of FIG. 1 in an other-station radio wave detecting mode.

During reception of an ISDB-T broadcast, the system control part 20 executes a processing subroutine for the other-station radio wave detecting mode shown in FIG. 2. This subroutine is executed, for example, at predetermined intervals by interrupting the main routine (description omitted) that is to be run full-time in synchronization with the internal clock.

The system control part 20, in accordance with the step 10 of the above-mentioned subroutine, detects whether the received signal error rate of the currently-receiving ISDB-T broadcast radio wave is lower than or equal to a predetermined value. Such an operation is associated not only with the software processing but also with the operations of the hardware device, or the receiver's individual parts, including reception of broadcast radio waves to demodulation of received data. The following provides a brief explanation thereof.

That is, ISDB-T broadcast radio waves from broadcast stations are received at the antenna 10. In the RF part 11, these radio waves are amplified and subjected to frequency conversion and/or other front end processing for high frequency signals, and then supplied to the station selection and tuning part 12.

The station selection and tuning part 12, in accordance with the station select command signal from the system control part 20, tunes and selects only the radio wave from a desired broadcast station out of the received radio waves. The resulting received radio wave is supplied to the detection and demodulation part 13.

ISDB-T broadcast radio waves are OFDM (Orthogonal Frequency Division Multiplex) modulated. Thus, the detection and demodulation part 13 provides two local oscillating carriers 13*a* and 13*b* having a 90 degree phase difference therebetween. The output signal from the station selection and tuning part 12 is multiplied by these carriers, so as to extract the orthogonal component and in-phase component included in that signal. Furthermore, the detection and demodulation part 13 converts these components into digital values in its analog/digital converter 13*c*. An AFC (Automatic Frequency Control) circuit 13*d* brings the values into frequency synchronization for OFDM demodulation, and a fast Fourier transformer 13*e* applies Fourier transformation thereto, whereby digital data included in the respective carriers is demodulated. The demodulated data is temporarily stored into an output buffer 13*f*, and subjected to such processing as deinterleaving and error correction to be described later. Then, the data is output to the output signal processing part 19 and other processing circuits at predetermined timing.

Supplied with the demodulated data from the above-mentioned buffer, the received signal error rate detection part 18 checks the error rate of the received signal. Generally, in ISDB-T broadcasting, send data is transmitted with error-correcting codes such as Reed-Solomon codes and convolution codes for the sake of high quality data transmission. However, despite such error-correcting processing, the signal error rate of the received data sometimes increases due to deterioration of radio wave propagation environment.

If the system control part 20 determines, at the step 10, that the result of the detection by the error rate detection part 18 exceeds a predetermined value, it terminates the subroutine shown in FIG. 2 without performing the detection of radio waves of other-stations. The reason for this is that interrupting the currently-receiving radio wave to perform the other-station detection in such a condition causes a received data loss, contributing a further increase in the error rate. In other words, the determination processing at the step 10 means that the other-station radio wave detection is not particularly conducted when the currently-receiving broadcast station has a poor reception status.

Here, the system control part 20 supplies the station selection and tuning part 12 with a station selection command signal for maintaining the tuning to the currently selected, received station.

If the error rate of the received signal is lower than or equal to the predetermined value at the step 10, the system control part 20 obtains the TMCC signal included in the demodulated data through the TMCC signal detection part 17, and analyzes the same (step 11).

The TMCC signal, as described before, is a kind of control signal included in ISDB-T broadcast data, and comprises parameter information that defines the modulation scheme of the ISDB-T broadcast radio waves as well as various attributes pertaining to digital data to be transmitted. A TMCC signal is 204-bit long, in which 3 bits in a group, or the maximum of 9 bits depending on the number of layers, are used as an identifier for indicating the amount of interleave of transmission data along the current time axis.

Sending data in ISDB-T broadcasting involves the addition of the error-correcting codes as described before. Therefore, received data can be error-corrected at the reception side even if dropouts of relatively short data, or random errors, occur during the data transmission. However, when losses of relatively long data, or burst errors, occur and the number of bits of the error-lost data exceeds the redundancy of the error-correcting codes, the error correction of data at the reception side becomes difficult.

Figure 3:
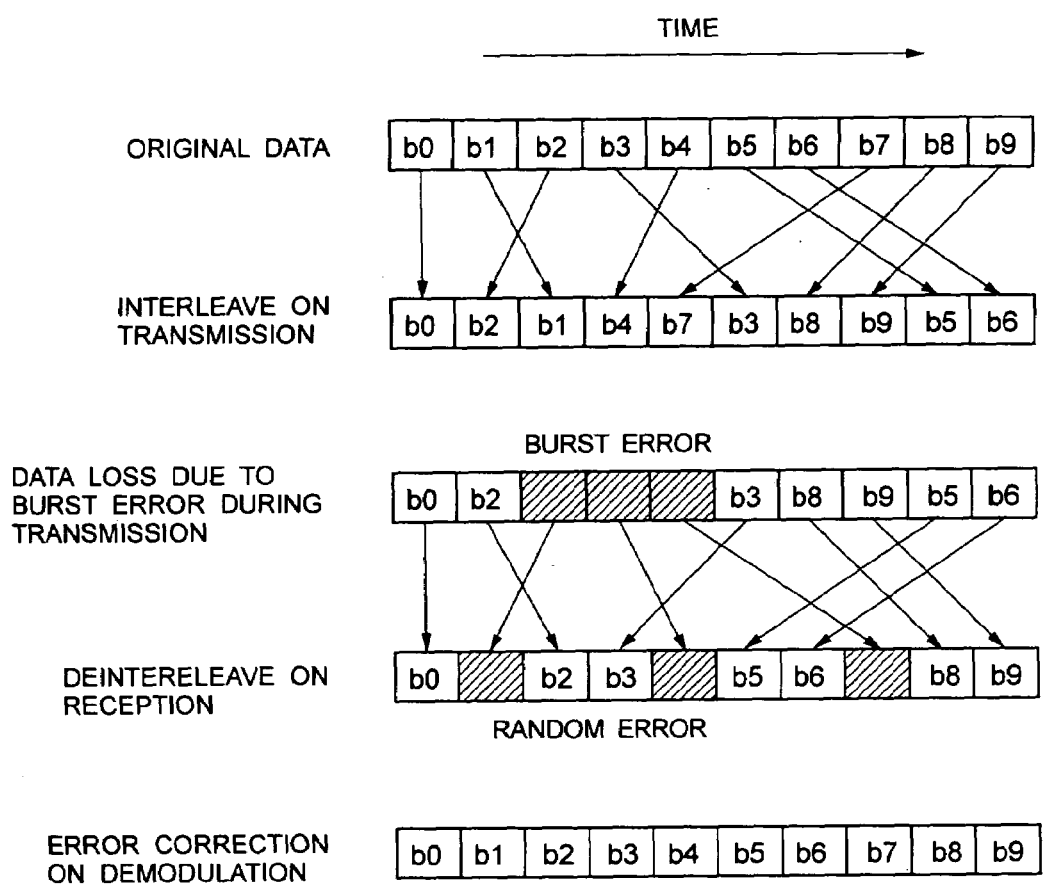
FIG. 3 is a time chart showing the time-based interleave and deinterleave to transmission data in IDSB-T broadcasting.

For this reason, in the ISDB-T broadcasting, data time series are interchanged in order (interleaved) under a predetermined procedure upon transmission as shown in FIG. 3. At the reception side, the received data time series are re-interchanged (deinterleaved) in the reverse procedure. When such operations are conducted, even if burst errors occur to lose relatively long data during transmission, the missing portions due to the burst errors can be distributed across the data time series by the deinterleaving at the reception side. This allows the missing portions to be processed as relatively short data dropouts, or random errors.

In other words, the application of the time-based interleave processing (hereinafter, simply referred to as interleave) can convert the data losses resulting from burst errors into random errors capable of being error-corrected.

The identifier in the TMCC signal, indicating the amount of interleave is a parameter for showing the degree of application of such interleave. The table of FIG. 4 shows the definition thereof. In FIG. 4, the interleave level 0 represents the state where no interleave is applied to transmission data. The amount of interleave applied to transmission data increases with ascending levels.

Incidentally, the amount of interleave depends on such parameters as the signal modulation scheme and the data attributes. Thus, it is difficult to show the real-time lengths of the burst-error data losses which the amounts of interleave at the individual levels shown in the table of FIG. 4 can deal with. Nevertheless, as the interleave level rises, i.e., the amount of interleave increases, the signal correction capability becomes greater with respect to the interruption of the received signal. From a different point of view, this means that received signals with greater amounts of interleave can be interrupted for longer time.

At the step 11, the system control part 20 checks the 35-th to 37-th bits of the TMCC signal (hereinafter, these three bits will be exclusively referred to as a TMCC signal) obtained from the TMCC signal detection part. If the value is "000," the system control part 20 terminates the subroutine of FIG. 2 without performing the other-station radio wave detection processing.

The following provides the reason for this. When the TMCC signal is "000," the currently-receiving ISDB-T broadcast data is not interleaved. Therefore, if the reception of such data is interrupted to perform the other-station radio wave detection, the deinterleave processing cannot convert the loss of data resulting from the interrupted reception into random errors, possibly failing to correct/recover the received data.

If the TMCC signal is not "000," the system control part 20, at the step 12, determines whether the TMCC signal is "001" or "010." If the TMCC signal is "001" or "010," then the system control part 20 starts the processing of detecting the received radio wave from other stations (step 13).

In this case, the currently-receiving digital data is interleaved at relatively lower level 1 or level 2 shown in the table of FIG. 4. Therefore, if for a relatively short period of time, the reception can be interrupted to detect other-station radio waves while the deinterleave processing in the detection and demodulation part 13 can convert the data loss resulting from the interruption of reception into random errors.

At the step 13, the system control part 20 generates station select command signals in accordance with a predetermined station selecting procedure and station selecting timing. The system control part 20 supplies the signals to the station selection and tuning part 12, thereby successively changing the tuning frequency so as to select broad stations other than the currently-receiving one. A variety of patterns are conceivable for such a station selecting procedure. Possible examples include a method in which the tuning frequency is swept across the receivable frequency band of the present receiver, and a method in which the frequencies of broadcast stations having been preset by the user from the operation input part 22 are successively picked up for scan.

Figure 5:
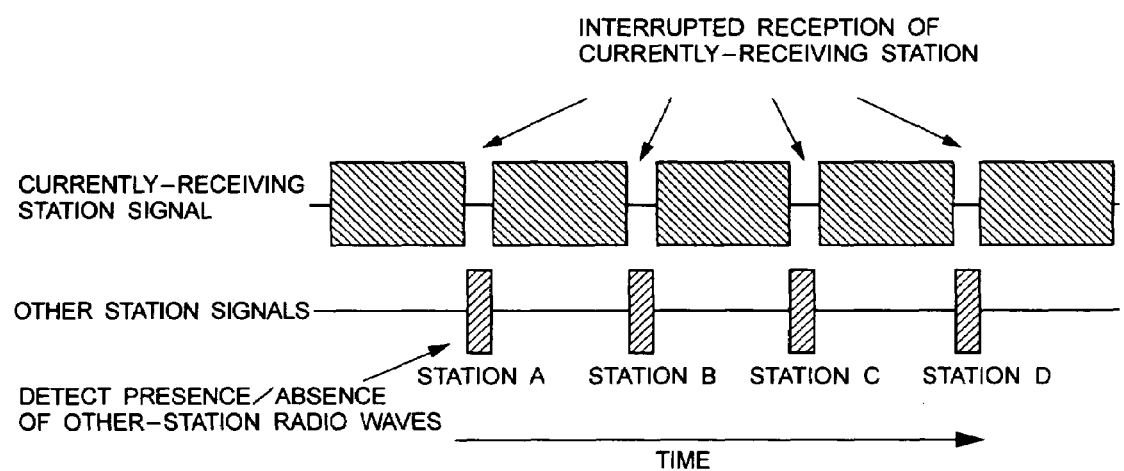
FIGS. 5 through 7 are time charts showing various examples of the station selecting procedures and station selecting timing in the receiver of FIG. 1 detecting other stations.
Figure 6:
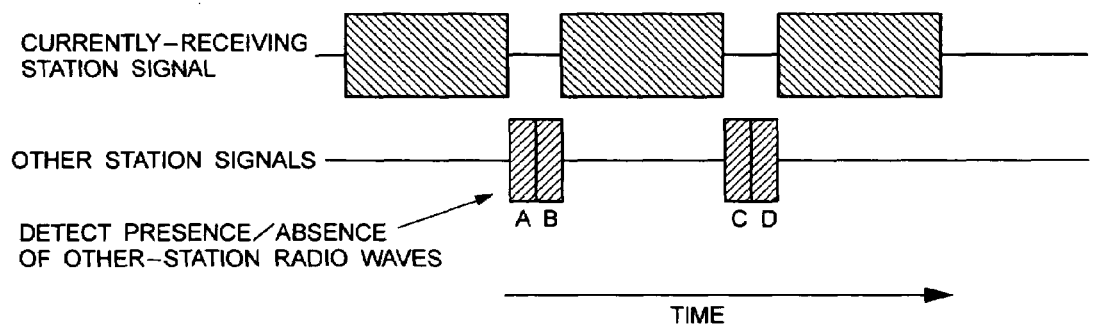

A variety of patterns are also conceivable for the station selecting timing. Among possible examples are a first example shown in FIG. 5 wherein a single other-station radio wave is detected each time the radio waves from the currently-receiving station are interrupted, and a second example shown in FIG. 6 wherein a plurality of radio waves from other-stations are detected upon each interruption.

The pattern of the first example is the case where the interruptions of the currently-receiving station are made as short as possible. Here, burst errors resulting from the interruptions can be reduced to a minimum, whereas it takes time to detect the reception status of all the other stations. On the other hand, the pattern of the second example is the case of adopting the maximum interruption time which causes no hitches in demodulating the data from the currently-receiving station. When compared with the first example, the second example has a higher probability of occurrence of burst errors due to noises and other disturbances. However, it allows a significant reduction of time required for detecting all the other stations.

Incidentally, the detection of the other-station reception status at the step 13 is limited to the detection of the presence/absence of radio waves of other-stations. This is because the smaller amount of interleave allows only short interruption time to be set.

Whether or not radio waves can be received at the other-station frequencies tuned and selected by the station selection and tuning part 12, is detectable by the received radio wave detection part 14 applying AM detection to the output signal of the station selection and tuning part 12. The received radio wave detection part 14 supplies the result to the system control part 20.

The system control part 20 stores the success or failure of the reception of the radio waves from the selected stations, as well as channel information of those other stations, into a storage area (hereinafter, referred to as memory table) on the RAM of the memory part 21. If all the other stations that are predetermined to be detected are scanned for, the system control part 20 terminates this subroutine (step 14).

If the TMCC signal is neither "001" nor "010" at the step 12, then the system control part 20, at the next step 15, determines whether the TMCC signal is "011" or "100."

When the TMCC signal is "011" or "100," the currently-receiving digital data is interleaved at relatively higher level 3 or level 4 shown in the table of FIG. 4. Thus, the radio waves from the currently-receiving broadcast station can be interrupted more than in the processing at the above-described step 13 while the deinterleave processing in the detection and demodulation part 13 can convert the data losses resulting from the interruption of reception into random errors.

Then, the system control part 20, if the TMCC signal is "011" or "100," performs not only the detection of the received radio waves from other stations but also makes determinations that require more processing time. Specifically, the system control part 20 determines the attributes of the radio waves from the detected stations, i.e., whether the detected stations are analog stations or digital stations.

Figure 7:
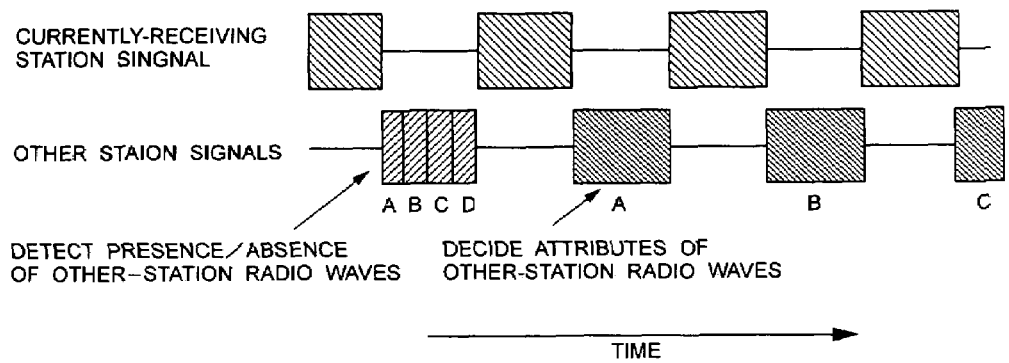

Here, the system control part 20 makes operations as in a third example shown in FIG. 7. That is, at the steps 16 and 17, the system control part 20 performs the same other-station radio waves detection processing as in the steps 13 and 14, so that the reception status of the radio waves from the other stations is temporarily stored into the memory table on the RAM area mentioned above. Next, in order to decide the attributes of the other-station radio waves, the system control part 20 searches the above-mentioned memory table, extracts only the other stations whose radio waves can be received, and supplies the station selection and tuning part 12 with station selection command signals for selecting those stations (step 18). The radio waves selected by the station selection and tuning part 12 based on such station selection commands are supplied to the received radio wave attribute decision part 15, whereby the attribute of the radio waves, or whether the selected radio waves are of ISDB-T broadcasting or of analog broadcasting, is decided.

The reason why such attribute decision is required is that the channel frequencies of analog broadcasts and ISDB-T broadcasts are allocated in the same frequency band. Here, simply checking the presence/absence of received radio waves will not always allow a decision as to whether that other station is an analog station or a digital station.

Generally, in analog broadcasting, picture signals are amplitude modulated for transmission. Therefore, the vicinities of the picture carriers and the vicinities of the subcarriers for color signals differ from each other in signal level. Moreover, each carrier produces harmonics at frequency intervals of the horizontal synchronization signal, which means a nonflat frequency spectrum. On the other hand, in the cases of ISDB-T broadcasting, digital data is OFDM modulated for transmission. Therefore, the spectrum is of rectangular shape with the signal level nearly equal throughout the frequency band.

Thus, the received radio wave attribute decision part 15 measures the output signal of the station selection and tuning part 12 for signal levels on a plurality of frequency points. The attribute decision part 15 then identifies whether radio waves selected are of analog broadcasting or ISDB-T broadcasting, based on the ratios of levels among the individual points. The result is supplied to the system control part 20.

Here, not only the result from the attribute decision part 15 but the result from the detection and demodulation part 13 may also be used as long as their combination enhances the reliability of the received radio wave attribute decision. More specifically, when analog broadcast radio waves are detected and demodulated by the detection and demodulation part 13, it naturally follows that the TMCC signal, a control signal added in ISDB-T broadcasting, cannot be detected. Accordingly, the difference in frequency spectrum described before and the presence/absence of the TMCC signal detection are combined to decide the attributes of the received radio waves.

Incidentally, in the present embodiment, the determination of attribute of received radio waves, i.e., the detection as to whether the received radio waves are analog radio waves or digital radio waves is based on the difference in frequency spectrum and/or the presence/absence of the TMCC signal as described above. However, the present invention is not limited thereto. For example, the presence/absence of guard intervals to be described later, the detection of their timing, and all may be used as long as they utilize a difference in broadcasting mode.

The system control part 20 selects receivable stations stored in the above-mentioned memory table on a one-by-one basis, and decides the attributes of the received radio waves of those stations based on the method described above. The results are stored into the memory table as the attributes of receivable other-station radio waves, along with channel information.

The system control part 20, if having determined the radio wave attributes of all the receivable stations stored in the memory table, terminates this subroutine (step 19).

Note that when the TMCC signal is neither "011" nor "100" at the step 15, the TMCC signal might be undefined one or the received radio wave might be of analog broadcasting which include no TMCC signal. Accordingly, in such cases, the system control part 20 terminates this subroutine with the currently-receiving station maintained as selected.

Through the foregoing processing, such information as other receivable stations and the airwave attributes of those stations are stored into the memory table on the RAM area of the memory part 21. Thus, when the user switches reception from the currently-receiving station to another, or when the currently-receiving station deteriorates in reception status to require switching of the received radio wave to another station broadcasting the same program, the system control part 20 has only to search the above-mentioned memory table so that other ISDB-T broadcast stations, or switch targets, can be extracted promptly and easily.

Now, ISDB-T broadcast radio waves are provided with guard intervals during data transmission. A guard interval is an effective symbol in transmission data, cut away in ¼- to ¹⁄₃₂-long at the tail and inserted into the interval from the preceding effective symbol. While the provision of such guard intervals lowers the data transmission efficiency, the guard interval periods can prevent delay interference resulting from reflected radio waves such as multipath radio waves. Accordingly, it becomes possible to prevent ghosts which are the biggest trouble to broadcast radio waves.

At the reception side, the effective symbols without the guard intervals can be exclusively demodulated to reproduce the transmission data. Therefore, during demodulation, windows extending along the time axis, covering effective symbols alone are established so that fast Fourier transformation is exclusively applied to the received signals in such windows. That is, even if guard intervals have data losses, the data demodulation suffers no influences therefrom.

In view of this, a modified embodiment of the present invention may include the processing of performing the other-station detecting operations by utilizing such guard interval periods.

More specifically, the guard interval detection part 16 detects whether or not guard intervals are provided for the currently-receiving ISDB-T broadcast data. If guard intervals are provided, the guard interval detection part 16 notifies the system control part 20 of it. Recognizing such a circumstance, the system control part 20, in detecting other-station radio waves (steps 13 and 16) or determining the attributes of other-station radio waves (step 18) in the flowchart shown in FIG. 2, exclusively uses guard interval periods or preferentially uses the guard interval periods to take steps for performing the detecting or determining operation.

The adoption of such steps can prevent losses of effective symbol parts in the currently-receiving data, thereby maintaining the received data within a favorable error rate.

Note that the present invention is not limited to ISDB-T broadcasts, and is applicable to any broadcast as long as the transmission data is interleaved along the time axis.

Moreover, in the other-station airwave detection and decision operations of the present embodiment, determinations have been exclusively made as to the presence/absence of radio waves from broadcast stations and as to whether the stations are analog stations or digital stations. However, when deciding the attributes of other-station radio waves, the determination may also include a variety of information such as the name of the program being broadcast, the program contents, and the genre.

In the present embodiment, the presence/absence of time-based interleave in the currently-receiving station signal and the amount of the interleave have been used as the conditions for other-station detection. However, the detection conditions are not limited thereto. What is essential is only that a broadcast reception status with no hitches to the demodulation of received data can be secured even if the other-station detection causes burst errors to the currently-receiving station signal. For example, such parameters as the transmission mode of the broadcast, the amount of guard intervals, and the method of modulation may be used as the detection conditions to make an other-station detecting operation as described in the embodiment. Moreover, these conditions and the time-based interleave may be put together into practice.

The present embodiment has been described with the ISDB-T broadcast receiver as an example. However, the present invention is not limited thereto, and is applicable to any digital broadcast receiver which transmits information in consecutive time series data. Besides, the present embodiment has used the TMCC signal to detect the time-based interleave, whereas the present invention is not limited thereto. Frame intervals or other identification signals may be used to detect the time-based interleave.

As has been detailed, according to the present invention, a digital broadcast receiver which transmits information in consecutive time series data can detect the reception status of other stations, and recognize receivable broadcast stations in advance, without deteriorating the reception status of the currently-receiving station. This means an improvement in the operability and convenience upon station selections.

What is claimed is:

1. A broadcast receiver comprising:
   a station selecting part for selecting a broadcast station specified by a station selection command;
   a detection and demodulation part for receiving a radio wave from said broadcast station, and detecting and demodulating said radio wave to generate a received signal;
   a signal analyzing part for analyzing said received signal and determining a signal processing mode;
   a station selection controlling part for generating said station selection command using the result from said signal analyzing part; and
   a reception status detecting part for interrupting, while receiving one broadcast station, the reception of said one broadcast station and receiving other broadcast stations based on said station selection command, thereby detecting a reception status of radio waves from the other stations,
   wherein said signal analyzing part extracts a control signal from said received signal and analyzes the control signal, said control signal indicating whether or not said received signal is interleaved along the time axis.

2. The broadcast receiver according to claim 1, wherein:
   said signal analyzing part detects the amount of interleave included in said control signal for analysis; and
   said station selection controlling part generates said station selection command in accordance with the result of said signal analyzing part detects the amount of the detection and analysis.

3. The broadcast receiver according to claim 2, wherein said station selection controlling part evaluates the reception status of the currently-receiving radio wave, and generates said station selection command so as to include the result of the evaluation.

4. The broadcast receiver according to claim 3, wherein said station selection controlling part generates, when the currently-receiving radio wave have a guard interval period in their signal, the station selection command for performing the reception of other broadcast stations during said period.

5. The broadcast receiver according to claim 1, wherein said reception status detecting part restarts reception of said one broadcast station after detecting the reception status of radio waves from the other stations.

6. A method of receiving broadcast radio waves, the method comprising:
   selecting a broadcast station specified by a station selection command;
   receiving a radio wave from said broadcast station, and detecting and demodulating said radio wave to generate a received signal;
   analyzing said received signal and determining a signal processing mode;
   generating said station selection command using the result from said analyzing of said received signal; and
   interrupting, while receiving one broadcast station, the reception of said one broadcast station and receiving other broadcast stations based on said station selection command, thereby detecting a reception status of radio waves from the other stations,
   wherein said analyzing comprises extracting a control signal from said received signal and analyzing the control signal, said control signal indicating whether or not said received signal is interleaved along the time axis.

7. The method according to claim 6, wherein:
   said analyzing comprises detecting the amount of interleave included in said control signal for analysis; and
   said generating comprises:
      generating said station selection command in accordance with the result of
      said analyzing; and
      detecting the amount of the detection and analysis.

8. The method according to claim 7, wherein generating said station selection command comprises:
   evaluating the reception status of the currently-receiving radio wave; and
   generating said station selection command so as to include the result of the evaluation.

9. The method according to claim 8, wherein generating said station selection command comprises generating, when the currently-receiving radio wave have a guard interval period in their signal, the station selection command for performing the reception of other broadcast stations during said period.

10. The broadcast receiver according to claim 6, further comprising restarting reception of said one broadcast station after detecting the reception status of radio waves from the other stations.

11. A broadcast receiver, comprising:
    a receiver circuit that receives a first broadcast signal;
    a control circuit that analyzes a characteristic of the first broadcast signal, that interrupts a reception of the first broadcast signal and instructs the receiver circuit to receive a second broadcast signal while the reception of the first broadcast signal is interrupted, and that determines a reception status of the second broadcast signal,
    wherein a duration that the control circuit interrupts the reception of the first broadcast signal varies based on the characteristic of the first broadcast signal.

12. The broadcast receiver as claimed in claim 11, wherein the control circuit evaluates a reception status of the first broadcast signal and interrupts the reception of the first broadcast signal depending on the reception status.

13. The broadcast receiver as claimed in claim 12, wherein control circuit instructs the receiver circuit to receive the second broadcast signal when the reception status of the second broadcast signal is better than the reception status of the first broadcast signal.

14. The broadcast received as claimed in claim 12, wherein after determining the reception status of the second broadcast signal, the control circuit instructs the receiver circuit to resume receiving the first broadcast signal, and wherein after the first receiver circuit resumes receiving the first broadcast signal, the control circuit instructs the receiver circuit to receive the second broadcast signal when the reception status of the second broadcast signal is better than the reception status of the first broadcast signal.

15. The broadcast receiver as claimed in claim 11, wherein the characteristic of the first broadcast signal comprises a degree to which data within the first broadcast signal is interleaved.

16. The broadcast receiver as claimed in claim 15, wherein the characteristic comprises the degree to which the data within the first broadcast signal is interleaved along a time axis.

17. The broadcast receiver as claimed in claim 11, wherein the control circuit interrupts the reception of the first broadcast signal for a first duration when the characteristic of the first broadcast signal corresponds to a first value, wherein the control circuit interrupts the reception of the first broadcast signal for a second duration when the characteristic of the first broadcast signal corresponds to a second value, and wherein the second duration is longer than the first duration.

18. The broadcast receiver as claimed in claim 17, wherein the control circuit evaluates a reception status and an attribute of the second broadcast signal when the first broadcast signal is interrupted for the second duration, and wherein the control circuit evaluates the reception status of the second broadcast signal, without evaluating the attribute when the first broadcast signal is interrupted for the first duration.

19. The broadcast receiver as claimed in claim 18, wherein the characteristic comprises the degree to which the data within the first broadcast signal is interleaved along a time axis.

* * * * *